United States Patent
Zhang et al.

(10) Patent No.: US 9,653,588 B2
(45) Date of Patent: May 16, 2017

(54) GAN SUBSTRATE, SEMICONDUCTOR DEVICE AND METHOD FOR FABRICATING GAN SUBSTRATE AND SEMICONDUCTOR DEVICE

(71) Applicant: Huawei Technologies Co., Ltd., Shenzhen (CN)

(72) Inventors: Zhenghai Zhang, Shanghai (CN); Zongmin Zhang, Shanghai (CN); Bocheng Cao, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/466,295

(22) Filed: Aug. 22, 2014

(65) Prior Publication Data

US 2014/0361311 A1    Dec. 11, 2014

Related U.S. Application Data

(63) Continuation of application No. PCT/CN2012/084300, filed on Nov. 8, 2012.

(30) Foreign Application Priority Data

Mar. 28, 2012 (CN) .......................... 2012 1 0086294

(51) Int. Cl.
*H01L 29/778* (2006.01)
*H01L 29/66* (2006.01)
(Continued)

(52) U.S. Cl.
CPC ...... *H01L 29/7786* (2013.01); *H01L 21/0237* (2013.01); *H01L 21/0254* (2013.01);
(Continued)

(58) Field of Classification Search
CPC ............... H01L 29/7786; H01L 29/205; H01L 21/02664; H01L 21/0237; H01L 21/02579;
(Continued)

(56) References Cited

U.S. PATENT DOCUMENTS

| | | | |
|---|---|---|---|
| 7,576,373 B1 | 8/2009 | Hikita et al. | |
| 7,777,252 B2 * | 8/2010 | Sugimoto | H01L 29/66462 257/192 |

(Continued)

FOREIGN PATENT DOCUMENTS

| | | |
|---|---|---|
| CN | 101022128 A | 8/2007 |
| CN | 101540365 A | 9/2009 |
| CN | 102637723 A | 8/2012 |

OTHER PUBLICATIONS

Von, V., et al., "Development and Study of AlGaN/GaN Microwave Transistors for High Power Operation," Thesis submitted Sep. 2006, Scientific Publication dated Nov. 14, 2007, 122 pages.
(Continued)

*Primary Examiner* — William Coleman
(74) *Attorney, Agent, or Firm* — Conley Rose, P.C.

(57) ABSTRACT

A gallium nitride (GaN) substrate, a semiconductor device, and methods for fabricating a GaN substrate and a semiconductor device are provided. The GaN substrate includes: a GaN base; an aluminum gallium nitride (AlGaN) layer, disposed on the GaN base; and a p-type conducting layer disposed on an active area of the AlGaN layer, and used to exhaust surface state negative electrons on the AlGaN layer and neutralize a dangling bond on the AlGaN layer. The p-type conducting layer is formed on the AlGaN layer, and a hole charge carrier in the p-type conducting layer can be used to exhaust the surface state negative electrons on an n-type AlGaN layer, neutralize the dangling bond on a section of the AlGaN layer, and prevent the forming of a
(Continued)

virtual gate, so as to suppress a current collapse effect of the semiconductor device fabricated using the GaN substrate.

17 Claims, 5 Drawing Sheets

(51) Int. Cl.
*H01L 29/20* (2006.01)
*H01L 21/02* (2006.01)
*H01L 29/06* (2006.01)
*H01L 29/205* (2006.01)

(52) U.S. Cl.
CPC .... *H01L 21/0262* (2013.01); *H01L 21/02389* (2013.01); *H01L 21/02458* (2013.01); *H01L 21/02579* (2013.01); *H01L 21/02664* (2013.01); *H01L 29/0619* (2013.01); *H01L 29/2003* (2013.01); *H01L 29/205* (2013.01); *H01L 29/66462* (2013.01)

(58) Field of Classification Search
CPC ............. H01L 21/0262; H01L 29/0619; H01L 29/785; H01L 21/0254; H01L 21/02389; H01L 21/02458; H01L 29/66462; H01L 29/2003

See application file for complete search history.

(56) References Cited

U.S. PATENT DOCUMENTS

| | | | |
|---|---|---|---|
| 8,129,748 B2* | 3/2012 | Uemoto | H01L 29/1066 257/192 |
| 8,603,880 B2* | 12/2013 | Yamada | H01L 29/2003 257/192 |
| 8,872,233 B2* | 10/2014 | Lim et al. | 257/194 |
| 8,962,409 B2* | 2/2015 | Tomabechi | H01L 29/66462 257/194 |
| 2007/0284653 A1 | 12/2007 | Ueno et al. | |
| 2008/0087915 A1 | 4/2008 | Uemoto et al. | |
| 2009/0236589 A1 | 9/2009 | Ohno et al. | |
| 2010/0252835 A1* | 10/2010 | Horie et al. | 257/76 |
| 2010/0258841 A1 | 10/2010 | Lidow et al. | |
| 2010/0258843 A1 | 10/2010 | Lidow et al. | |
| 2012/0068227 A1 | 3/2012 | Hikita et al. | |

OTHER PUBLICATIONS

Foreign Communication From a Counterpart Application, PCT Application No. PCT/CN2012/084300, English Translation of International Search Report dated Feb. 28, 2013, 3 pages.
Foreign Communication From a Counterpart Application, PCT Application No. PCT/CN20121084300, English Translation of Written Opinion dated Feb. 28, 2013, 8 pages.
Foreign Communication From a Counterpart Application, European Application No. 12873311.0, Extended European Search Report dated Jan. 27, 2015, 6 pages.
Stampfl, C., et al., "Doping of Al(x)Ga(1-x)N alloys," Elsevier, Materials Science and Engineering B59, 1999, pp. 253-257.
Foreign Communication From a Counterpart Application, European Application No. 12873311.0, European Office Action dated Apr. 22, 2016, 7 pages.

* cited by examiner

GAN SUBSTRATE, SEMICONDUCTOR DEVICE AND METHOD FOR FABRICATING GAN SUBSTRATE AND SEMICONDUCTOR DEVICE

CROSS-REFERENCE TO RELATED APPLICATIONS

This application is a continuation of International Application No. PCT/CN2012/084300, filed on Nov. 8, 2012, which claims priority to Chinese Patent Application No. 201210086294.5, filed on Mar. 28, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to a microelectronic technology, and in particular, to a gallium nitride (GaN) substrate, a semiconductor device and methods for fabricating a GaN substrate and a semiconductor device.

BACKGROUND

GaN, a third generation wide bandgap semiconductor material, draws much attention because of its characteristics of wide bandgap, high breakdown voltage, high saturation electron velocity and the like. A silicon (Si) based lateral double-diffused metal-oxide semiconductor (LDMOS) increasingly cannot meet requirements of a base station power amplifier system for high frequency, high efficiency, large bandwidth and the like; therefore, a new generation power amplifier device fabricated by using a GaN high electron mobility transistor (HEMT) device will gradually replace the LDMOS as a dominating device in the field of base station power amplifiers.

However, the GaN HEMT device frequently generates a current collapse effect, which may cause decrease of direct drain currents, gains and radio frequency output power of the GaN HEMT device. How to reduce the current collapse effect becomes a problem that needs to be solved urgently.

SUMMARY

Embodiments of the present invention provide a GaN substrate, a semiconductor device and methods for fabricating a GaN substrate and a semiconductor device, so as to reduce a collapse effect of the semiconductor device caused by the GaN substrate.

A first aspect of the embodiments of the present invention provides a GaN substrate, including: a GaN base; an aluminum gallium nitride (AlGaN) layer, disposed on the GaN base; and a p-type conducting layer, disposed on an active area of the AlGaN layer, and used to exhaust surface state negative electrons on the AlGaN layer and neutralize a dangling bond on the AlGaN layer.

Another aspect of the embodiments of the present invention provides a semiconductor device, including the GaN substrate and a semiconductor structure formed on the GaN substrate.

Still another aspect of the embodiments of the present invention provides a method for fabricating a GaN substrate, including: forming an AlGaN layer on a GaN base; and forming a p-type conducting layer on an active area of the AlGaN layer, where the p-type conducting layer is used to exhaust surface state negative electrons on the AlGaN layer and neutralize a dangling bond on the AlGaN layer.

Yet another aspect of the embodiments of the present invention provides a method for fabricating a semiconductor device, including: forming a GaN substrate according to the foregoing method for fabricating a GaN substrate; and forming a semiconductor structure on the GaN substrate.

In the GaN substrate, the semiconductor device and methods for fabricating the GaN substrate and the semiconductor device provided by the embodiments of the present invention, a p-type conducting layer is formed on an AlGaN layer, and a hole charge carrier on the p-type conducting layer can be used to exhaust surface state negative electrons on an n-type AlGaN layer, neutralize a dangling bond on a section of the AlGaN layer, and prevent the forming of a virtual gate, so as to suppress a current collapse effect of the semiconductor device fabricated using the GaN substrate, thereby improving performance of the semiconductor device, and enhancing reliability of the semiconductor device.

BRIEF DESCRIPTION OF THE DRAWINGS

To describe the technical solutions in the embodiments of the present invention or in the prior art more clearly, the following briefly introduces the accompanying drawings required for describing the embodiments or the prior art. The accompanying drawings in the following description show merely some embodiments of the present invention, and persons of ordinary skill in the art may still derive other drawings from these accompanying drawings without creative efforts.

DETAILED DESCRIPTION

The following clearly describes the technical solutions in the embodiments of the present invention with reference to accompanying drawings in the embodiments of the present invention. The described embodiments are merely a part rather than all of the embodiments of the present invention. All other embodiments obtained by persons of ordinary skill in the art based on the embodiments of the present invention without creative efforts shall fall within the protection scope of the present invention. It should be noted that the accompanying drawings all adopt a rather simplified form and all use an inexact ratio, and are only used for conveniently and clearly describing the embodiments of the present invention.

That a film layer is on another film layer or structure described in the following embodiments may refer to that the film layer is directly on the another film layer or structure, and may also refer to that another film layer or structure exists therebetween.

Embodiment 1

This embodiment provides a method for fabricating a GaN substrate.

Figure 1:
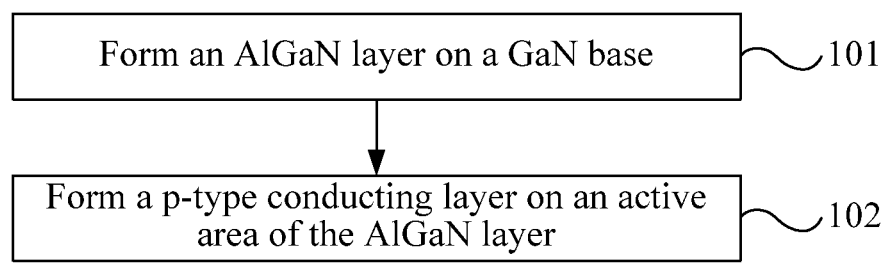
FIG. 1 is a schematic flowchart of a method for fabricating a GaN substrate according to an embodiment of the present invention.

FIG. 1 is a schematic flowchart of the method for fabricating a GaN substrate according to this embodiment. Specific steps are as follows:

Step 101: Form an AlGaN layer on a GaN base.

The semiconductor base may be a GaN base of any type, and preferably, a composite base whose surface layer is a GaN layer. For example, the GaN base includes a base layer and a GaN layer that are formed sequentially, where the base layer may be made of silicon carbide (SiC), sapphire, or Si.

Step 102: Form a p-type conducting layer on an active area of the AlGaN layer, where the p-type conducting layer is used to exhaust surface state negative electrons on the AlGaN layer and neutralize a dangling bond on the AlGaN layer.

The active area of the AlGaN layer is an area where a gate electrode, a source electrode, and a drain electrode are to be formed, and/or an area between the electrodes.

In an implementation manner, an area other than the active area is covered with photoresist, then the p-type conducting layer is formed on the active area, and the photoresist and the p-type conducting layer outside the active area are removed. In another implementation manner, the p-type conducting layer is formed on the AlGaN layer, then a layer of photoresist is formed on the active area, the p-type conducting layer outside the active area is removed, and finally the photoresist is removed. A specific forming manner may be selected according to a practical requirement, which will not be described herein.

In the method for fabricating a GaN substrate according to this embodiment, a p-type conducting layer is formed on an AlGaN layer, and a hole charge carrier in the p-type conducting layer can be used to exhaust surface state negative electrons on the n-type AlGaN layer, neutralize a dangling bond on a section of the AlGaN layer, and prevent the forming of a virtual gate, so as to suppress a current collapse effect of a semiconductor device fabricated using the GaN substrate, thereby improving performance of the semiconductor device, and enhancing reliability of the semiconductor device.

Embodiment 2

This embodiment provides a method for forming a GaN substrate.

Figure 2:
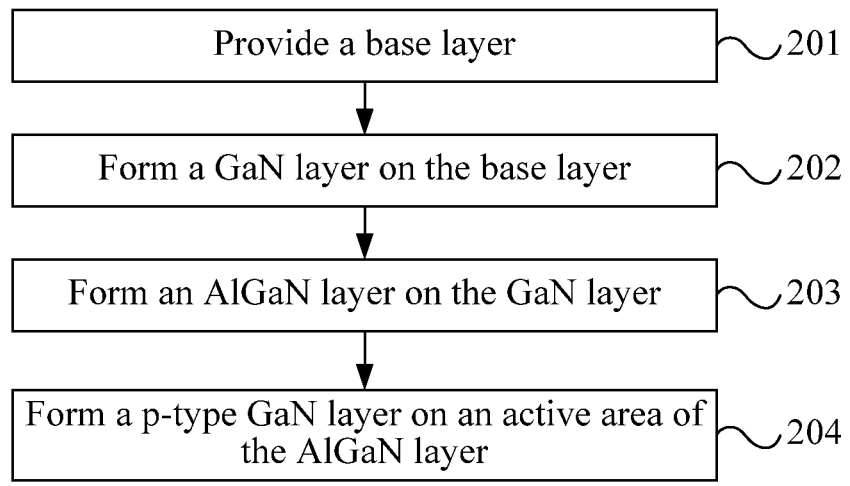
FIG. 2 is a schematic flowchart of a method for fabricating a GaN substrate according to another embodiment of the present invention.

FIG. 2 is a schematic flowchart of the method for forming a GaN substrate according to this embodiment.

Step 201: Provide a base layer.

A material of the base layer may be SiC, sapphire, or Si. A SiC layer is used in this embodiment.

Step 202: Form a GaN layer on the base layer.

In this step, a metal-organic chemical vapor deposition (MOCVD) method may be used to form the GaN layer at a temperature of around 900 degrees Celsius (° C.), where trimethyl gallium (TMGa) and ammonia gas ($NH_3$) may be used as source gases, and thickness of the GaN layer may be 1 to 2 micrometers (μm). Preferably, the GaN layer is an undoped GaN layer.

Step 201 and step 202 are steps that form a GaN base.

Step 203: Form an AlGaN layer on the GaN layer.

Thickness of the AlGaN layer may be 25 nanometers (nm) to 35 nm, a specific forming method may be growing the AlGaN layer on the GaN layer at a temperature of around 1100° C. by using the MOCVD method, where TMGa, trimethylaluminum (TMAl) and $NH_3$ may be used as source gases, and preferably, the AlGaN layer is an undoped AlGaN layer.

Step 204: Form a p-type GaN layer on an active area of the AlGaN layer, where the p-type conducting layer is used to exhaust surface state negative electrons on the AlGaN layer and neutralize a dangling bond on the AlGaN layer.

Step 204 may specifically be: forming a layer of photoresist on the AlGaN layer, and performing an exposure operation on the photoresist, so as to form a photoresist layer with a pattern, that is, the active area is not covered with the photoresist, and the other area is covered with the photoresist.

Then, a p-type GaN layer is formed on the photoresist layer with the pattern, where the p-type GaN layer may be a GaN layer doped with beryllium (Be), a GaN layer doped with zinc (Zn), or a GaN layer doped with magnesium (Mg). A forming method is as follows:

Method 1: Molecular beam epitaxy (MBE) is used to grow GaN. A specific example is that a GaN layer is formed on AlGaN first, and then Be is implanted into the GaN layer by using an ion implantation technology, so as to form a p-type GaN layer. Be has high solid solubility in a semiconductor of group III-IV compound, for example, GaN; therefore, a hole density as high as $10^{18}$ centimeters$^{-3}$ ($cm^{-3}$) can be obtained, which can effectively exhaust surface state negative electrons on the AlGaN layer and neutralize a dangling bond on a section of the AlGaN layer.

Method 2: An MOCVD method is used to grow a GaN layer containing Zn. A specific manner may be that a p-type GaN layer of around 10 nm and doped with Zn element is grown on an active area of AlGaN with TMGa, methyl dicyclopentadienyl zinc ($Cp_2Zn$), and $NH_3$ as source gases, hydrogen ($H_2$) as a carrier gas, and a temperature of 1100° C. The p-type GaN can effectively exhaust surface state negative electrons on the AlGaN layer and neutralize a dangling bond on a section of the AlGaN layer.

Method 3: In an MOCVD reaction chamber, a GaN layer of 8 to 12 nm thick and doped with Mg is grown on AlGaN with a gas mixture of $NH_3$, TMGa, and bis-cyclopentadienyl magnesium ($Cp_2Mg$) as a source gas; $H_2$ as a carrier gas; a reaction pressure of 2 to 3 Pascal (Pa); and a growth temperature of 900 to 1100° C. Then, annealing treatment is performed on the GaN layer doped with Mg in a nitrogen ($N_2$) atmosphere of 700 to 800° C., where an annealing duration is 20 to 30 minutes, so as to form the final p-type conducting GaN layer. This method can obtain a hole density of $10^{17}$ to $10^{18}$ $cm^{-3}$. The hole density is high; therefore, surface state negative electrons on the AlGaN layer can be effectively exhausted and a dangling bond on a section of the AlGaN layer can be effectively neutralized. In addition, this method does not need addition of a new deposition device, that is, no excessive cost is required. Besides, the n-type AlGaN and the p-type GaN layer doped with Mg have small lattice thermal mismatch, which is conducive to improving performance of the whole GaN substrate.

Preferably, a buffer layer may be grown between step 201 and step 202. The buffer layer may be formed by aluminum nitride (AlN). Specifically, the buffer layer is grown by using the MOCVD method at a temperature of around 1100° C.

TMAl and NH$_3$ may be used as source gases, and thickness of the buffer layer may be 10 to 200 nm, and preferably, 10 nm. A function of the buffer layer AlN is that the GaN layer and the SiC layer have large lattice mismatch, resulting in poor adhesivity; therefore, the AlN layer can reduce defect density resulting from stress mismatch which is caused by the lattice mismatch and increase adhesivity between GaN and SiC, and AN has buffering and transition functions.

In the method for fabricating a GaN substrate according to this embodiment, a p-type GaN layer is formed on an AlGaN layer, and a hole charge carrier in the p-type GaN layer can be used to exhaust surface state negative electrons on the n-type AlGaN layer, neutralize a dangling bond on a section of the AlGaN layer, and prevent the forming of a virtual gate, so as to suppress a current collapse effect of a semiconductor device fabricated using the GaN substrate, thereby improving performance of the semiconductor device and enhancing reliability of the semiconductor device.

Embodiment 3

This embodiment provides a method for fabricating a semiconductor device.

In this embodiment, the semiconductor device is fabricated using the GaN substrate formed in Embodiment 1 or Embodiment 2 as a substrate. Forming a GaN layer doped with Mg on AlGaN is used as an example for description in the following.

Step 301: Provide a base layer.

A material of the base layer may be SiC, sapphire, or Si.

Step 302: Form a GaN layer on the base layer.

In this step, an MOCVD method may be used to form the GaN layer at a temperature of around 900° C., where TMGa and NH$_3$ may be used as source gases, and thickness of the GaN layer may be 1 to 2 μm. Preferably, the GaN layer is an undoped GaN layer.

Step 301 and step 302 are steps that form a GaN base.

Step 303: Form an AlGaN layer on the GaN layer.

Thickness of the AlGaN layer may be 25 nm to 35 nm, a specific forming method may be growing the AlGaN layer on the GaN layer at a temperature of around 1100° C. by using the MOCVD method, where TMGa, TMAl and NH$_3$ may be used as source gases, and preferably, the AlGaN layer is an undoped AlGaN layer.

Step 304: Form a GaN layer doped with Mg on an active area of the AlGaN layer.

Step 304 may specifically be forming a layer of photoresist on the AlGaN layer, and performing an exposure operation on the photoresist, so as to form a photoresist layer with a pattern, that is, the active area is not covered with the photoresist, and the other area is covered with the photoresist.

Then, the GaN layer doped with Mg is formed on the photoresist layer with the pattern. A forming method is as follows:

In an MOCVD reaction chamber, a GaN layer of 8 to 12 nm thick and doped with Mg is grown on AlGaN with a gas mixture of NH$_3$, TMGa, and Cp$_2$Mg as a source gas; H$_2$ as a carrier gas; a reaction pressure of 2 to 3 Pa; and a growth temperature of 900 to 1100° C. Then, annealing treatment is performed on the GaN layer doped with Mg in an N$_2$ atmosphere of 700 to 800° C., where an annealing duration is 20 to 30 minutes, so as to form a final p-type conducting GaN layer. This method can obtain a hole density of $10^{17}$ to $10^{18}$ cm$^{-3}$. The hole density is high; therefore, surface state negative electrons on the AlGaN layer can be effectively exhausted and a dangling bond on a section of the AlGaN layer can be effectively neutralized. In addition, this method does not need addition of a new deposition device, that is, no excessive cost is required. Besides, the n-type AlGaN layer and the p-type GaN layer doped with Mg have small lattice thermal mismatch, which is conducive to improving performance of the whole GaN substrate.

Preferably, a buffer layer may be grown between step 301 and step 302. The buffer layer may be formed by AN. The buffer layer is grown by using the MOCVD method at a temperature of around 1100° C. TMAl and NH$_3$ may be used as source gases, and thickness of the buffer layer may be 10 to 200 nm, and preferably, 10 nm.

Step 305: Form a semiconductor structure on the GaN substrate.

A specific description of the semiconductor structure is as follows:

First, a source electrode and a drain electrode are formed on the GaN substrate. Specifically, a photolithography technology is adopted, and photoresist is used to cover an area other than the area where the source electrode and the drain electrode are formed. Then, it is an option to form a composite metal layer by directly and sequentially evaporating titanium (Ti) of around 14 to 16 nm, aluminum (Al) of around 200 nm, Ti of around 14 to 16 nm, gold (Au) of around 10 to 15 nm and the like, it is another option to remove an exposed part of the p-type GaN by etching the exposed part, evaporate the composite metal layer, and remove the photoresist and the metal Ti/Al/Ti/Au in a non-active area by using an etching method. In this way, the source electrode and the drain electrode constituted by the composite metal layer are formed.

Then, an isolation operation is performed on the active area. Specifically, an ion implantation method may be used to form an isolation area, for example, implanting boron (B) ions. A specific operation is described in the prior art, and will not be repeated herein.

Next, a gate electrode is formed on the GaN substrate. Specifically, the photolithography technology is adopted, the photoresist is used to cover an area other than a preset area where the gate electrode is formed, the p-type GaN layer where the gate electrode 601 is located is removed by etching, and nickel (Ni) of around 50 nm and Au of around 500 nm are sequentially evaporated. Then, the photoresist and an undesired Ni/Au film layer are removed by using an etching technology, so as to form the gate electrode constituted by Ni/Au. Afterwards, annealing treatment is performed, for example, thermal processing is performed for 2 to 3 minutes under a condition of around 700° C., so as to form ideal Schottky contact between the gate electrode and the GaN substrate.

The forming the semiconductor structure in this step may further include forming a metal interconnection layer on the GaN substrate where the gate electrode, the source electrode and the drain electrode are formed, where the metal interconnection layer may be formed on the source electrode and the drain electrode. In the prior art, metal interconnection layers formed by various metal interconnection processes are already available, which will not be described herein again.

Optionally, after the metal interconnection layer is formed, a plasma enhanced chemical vapor deposition (PECVD) method may be further used to deposit a silicon nitride (SiN) passivation layer. The SiN passivation layer can be used for protection, for example, absorbing moisture in the air that enters the semiconductor device, so as to avoid affecting conductivity of the source electrode and the drain electrode and improve reliability of the semiconductor device with a GaN substrate.

According to the method for fabricating a semiconductor device formed in this embodiment, in a substrate used by the semiconductor device, a p-type GaN layer is formed on an AlGaN layer, and a hole charge carrier in the p-type GaN layer can exhaust surface state negative electrons on the n-type AlGaN layer, neutralize a dangling bond on a section of the AlGaN layer, and prevent the forming of a virtual gate, so as to suppress a current collapse effect of the semiconductor device according to this embodiment, thereby improving performance of the semiconductor device, and enhancing reliability of the semiconductor device.

Embodiment 4

This embodiment provides a GaN substrate.

Figure 3:
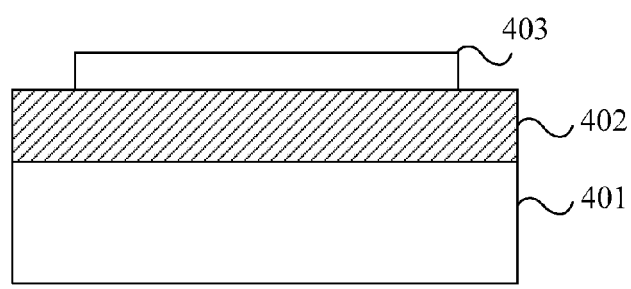
FIG. 3 is a schematic structural diagram of a GaN substrate according to still another embodiment of the present invention.

FIG. 3 is a schematic structural diagram of a GaN substrate according to this embodiment.

The GaN substrate includes a GaN base 401, an AlGaN layer 402, and a p-type conducting layer 403.

The GaN base may be a GaN base of any type, and preferably, a composite base whose surface layer is a GaN layer. For example, the GaN base includes a base layer and a GaN layer that are formed sequentially, where the base layer may be made of SiC, sapphire, or Si. The AlGaN layer 402 is disposed on the GaN base 401. The p-type conducting layer 403 is disposed on an active area of the AlGaN layer 402, and is used to exhaust surface state negative electrons on the AlGaN layer 402 and neutralize a dangling bond on the AlGaN layer 402.

A specific method for fabricating the GaN substrate is similar to the foregoing embodiments, and is not repeated herein.

According to the GaN substrate in this embodiment, the p-type conducting layer 403 is formed on the AlGaN layer 402, and a hole charge carrier in the p-type conducting layer 403 can be used to exhaust surface state negative electrons on the n-type AlGaN layer 402, neutralize a dangling bond on a section of the AlGaN layer 402, and prevent the forming of a virtual gate, so as to suppress a current collapse effect of a semiconductor device fabricated using the GaN substrate, thereby improving performance of the semiconductor device, and enhancing reliability of the semiconductor device.

Embodiment 5

This embodiment provides a specific GaN substrate based on Embodiment 4.

Figure 4:
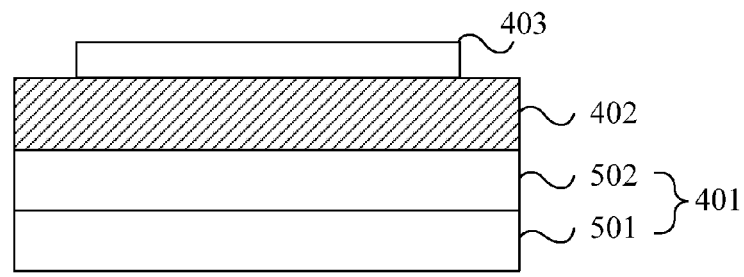
FIG. 4 is a schematic structural diagram of a GaN substrate according to yet another embodiment of the present invention.

FIG. 4 is a schematic structural diagram of a GaN substrate according to this embodiment. The GaN substrate specifically includes a base layer 501, a GaN layer 502, the AlGaN layer 402, and the p-type GaN layer 403 that are formed sequentially. The base layer 501 and the GaN layer 502 form the GaN base 401.

The base layer 501 in this embodiment adopts SiC. The GaN layer 502 may be formed by using an MOCVD method at a temperature of around 900° C., where TMGa and $NH_3$ may be used as source gases, and thickness of the GaN layer 502 may be 1 to 2 μm. Preferably, the GaN layer 502 is an undoped GaN layer. Thickness of the AlGaN layer 402 may be 25 nm to 35 nm, a specific forming method may be growing the AlGaN layer 402 on the GaN layer at a temperature of around 1100° C. by using the MOCVD method, where TMGa, TMAl and $NH_3$ may be used as source gases, and preferably, the AlGaN layer 402 is an undoped AlGaN layer. The p-type GaN layer 403 may specifically be a GaN layer doped with Be, a GaN layer doped with Zn, or a GaN layer doped with Mg. A forming method is as follows:

Method 1: MBE is used to grow the GaN layer 403. A specific example is that a GaN layer is formed on AlGaN first, and then Be is implanted into the GaN layer by using an ion implantation technology, so as to form the p-type GaN layer 403. Be has high solid solubility in a semiconductor of group III-IV compound such as GaN; therefore, a hole density over $10^{18}$ $cm^{-3}$ can be obtained, which can effectively exhaust surface state negative electrons on the AlGaN layer and neutralize a dangling bond on a section of the AlGaN layer.

Method 2: An MOCVD method is used to grow a GaN layer 403 containing Zn. A specific manner may be that a p-type GaN layer of around 10 nm and doped with Zn element is grown on an active area of AlGaN with TMGa, $Cp_2Zn$, and $NH_3$ as source gases, $H_2$ as a carrier gas, and a temperature of 1100° C. The p-type GaN can effectively exhaust surface state negative electrons on the AlGaN layer and neutralize a dangling bond on a section of the AlGaN layer.

Method 3: in an MOCVD reaction chamber, a GaN layer of 8 to 12 nm thick and doped with Mg is grown on the AlGaN layer with a gas mixture of $NH_3$, TMGa, and $Cp_2Mg$ as a source gas; $H_2$ as a carrier gas; a reaction pressure of 2 to 3 Pa; and a growth temperature of 900 to 1100° C. Then, annealing treatment is performed on the GaN layer doped with Mg in an $N_2$ atmosphere of 700 to 800° C., where an annealing duration is 20 to 30 minutes, so as to form a final p-type conducting GaN layer. This method can obtain a hole density of $10^{17}$ to $10^{18}$ $cm^{-3}$. The hole density is high; therefore, surface state negative electrons on the AlGaN layer can be effectively exhausted and a dangling bond on a section of the AlGaN layer can be effectively neutralized. In addition, this method does not need addition of a new deposition device, that is, no excessive cost is required. Besides, the n-type AlGaN and the p-type GaN layer doped with Mg have small lattice thermal mismatch, which is conducive to improving performance of the whole GaN substrate.

Preferably, a buffer layer 503 may be grown between the base layer 501 and the GaN layer 502. The buffer layer 503 may be an AlN layer. Specifically, the buffer layer 503 is grown by using the MOCVD method at a temperature of around 1100° C. TMAl and $NH_3$ may be used as source gases, and thickness of the buffer layer 503 may be 10 to 200 nm, and preferably, 10 nm. A function of the buffer layer is that the GaN layer and the SiC layer have large lattice mismatch, resulting in poor adhesivity; therefore, the AlN layer 503 can reduce defect density resulting from stress mismatch which is caused by the lattice mismatch and increase adhesivity between GaN and SiC, and the AlN layer 503 has buffering and transition functions.

According to the GaN substrate in this embodiment, the p-type GaN layer 403 is formed on the AlGaN layer 402, and a hole charge carrier in the p-type GaN layer 403 can be used to exhaust surface state negative electrons on the n-type AlGaN layer 402, neutralize a dangling bond on a section of the AlGaN layer 402, and prevent the forming of a virtual gate, so as to suppress a current collapse effect of a semiconductor device fabricated using the GaN substrate, thereby improving performance of the semiconductor device, and enhancing reliability of the semiconductor device.

Embodiment 6

This embodiment provides a semiconductor device, and a specific forming method is described in Embodiment 3.

Specifically, FIG. 5A to FIG. 5E are schematic structural diagrams of a semiconductor device according to this embodiment.

The semiconductor device includes the semiconductor substrate described in Embodiment 4 or Embodiment 5. FIG. 5A to FIG. 5E each show a structure of the semiconductor substrate described in Embodiment 5, and a specific structure and a forming manner of the semiconductor substrate are consistent with that in the foregoing embodiments, which will not be described herein again. A semiconductor structure is further provided on the semiconductor substrate, and the semiconductor structure specifically includes a gate electrode 601, a source electrode 602, and a drain electrode 603, and may further include a metal interconnection layer 604 and/or a SiN passivation layer 605.

Figure 5A:
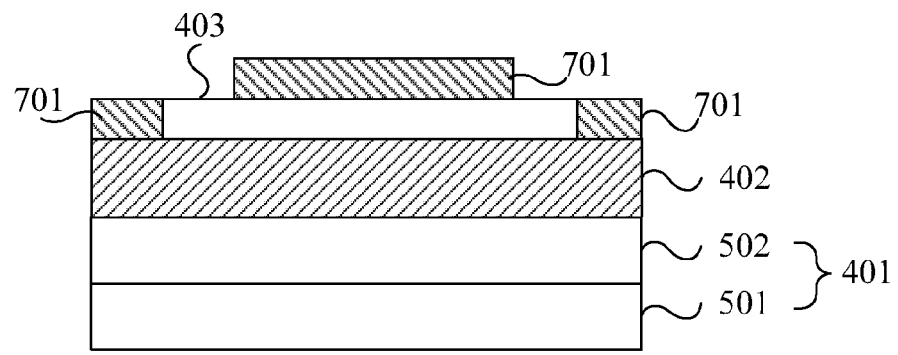
FIG. 5A to FIG. 5E are schematic structural diagrams of a semiconductor device according to another embodiment of the present invention.
Figure 5B:
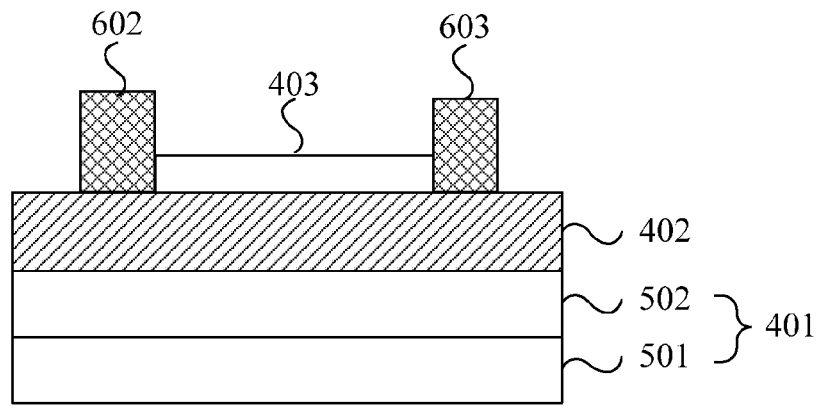

A forming manner of the semiconductor structure is specifically as follows:

First, the source electrode 602 and the drain electrode 603 are formed on a GaN substrate. Specifically, as shown in FIG. 5A, a photolithography technology is adopted, and photoresist 701 is used to cover an area other than the area where the source electrode 602 and the drain electrode 603 are formed. Then, it is an option to remove an exposed part of the p-type GaN by etching the exposed part, and form a composite metal layer (as shown in FIG. 5A) by sequentially evaporating Ti of around 14 to 16 nm, Al of around 200 nm, Ti of around 14 to 16 nm, Au of around 10 to 15 nm and the like. It is another option to form the composite metal layer by direct and sequential evaporation. After that, the photoresist and metal Ti/Al/Ti/Au in a non-active area are removed by using an etching method. As shown in FIG. 5B, in this way, the source electrode 602 and the drain electrode 603 constituted by the composite metal layer Ti/Al/Ti/Au are formed.

Then, an isolation operation is performed on an active area (not shown). Specifically, an ion implantation method may be used to form an isolation area, for example, implanting B ions. A specific operation is described in the prior art, and will not be repeated herein.

Figure 5C:
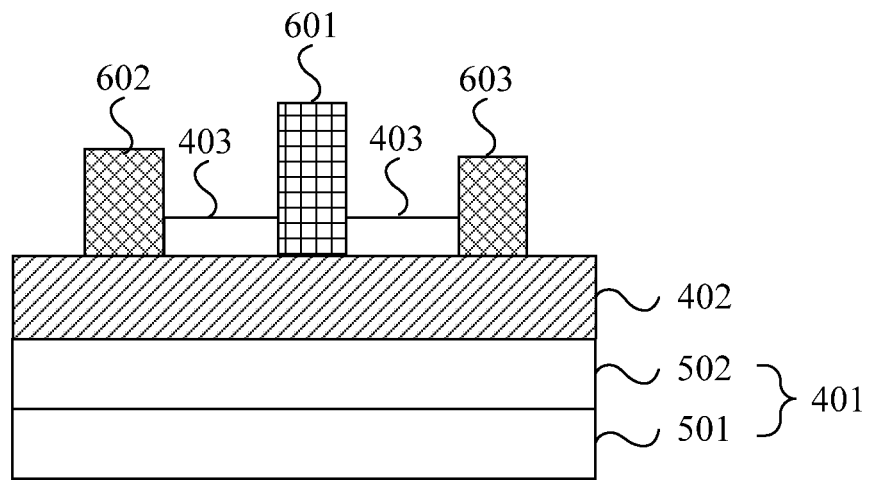

Next, as shown in FIG. 5C, the gate electrode 601 is formed on the GaN substrate. Specifically, the photolithography technology is adopted, the photoresist is used to cover an area other than a preset area where the gate electrode 601 is formed, and the p-type GaN layer 403 where the gate electrode 601 is located is removed by etching. Ni of around 50 nm and Au of around 500 nm are sequentially evaporated. Definitely, it is an option to directly evaporate Ni and Au without removing the p-type GaN layer 403. Then, the photoresist and an undesired Ni/Au film layer are removed by using an etching technology, so as to form the gate electrode 601 constituted by Ni/Au shown in FIG. 5C. Afterwards, annealing treatment is performed, for example, thermal processing is performed for 2 to 3 minutes under a condition of around 700° C., so as to form ideal Schottky contact between the gate electrode 601 and the GaN substrate.

Figure 5D:
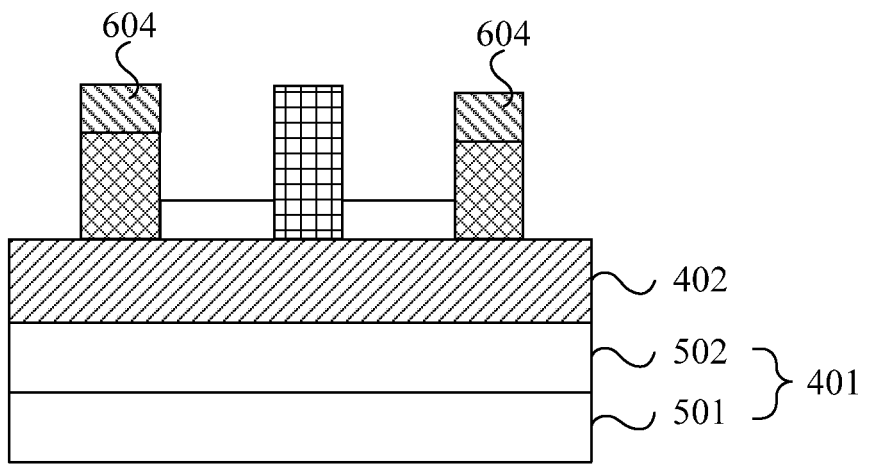

Then, as shown in FIG. 5D, the metal interconnection layer 604 is formed on the GaN substrate where the gate electrode 601, the source electrode 602 and the drain electrode 603 are formed, and the metal interconnection layer 604 may be formed on the source electrode 602 and the drain electrode 603. In the prior art, metal interconnection layers formed by various metal interconnection processes are already available, which will not be described herein again.

Figure 5E:
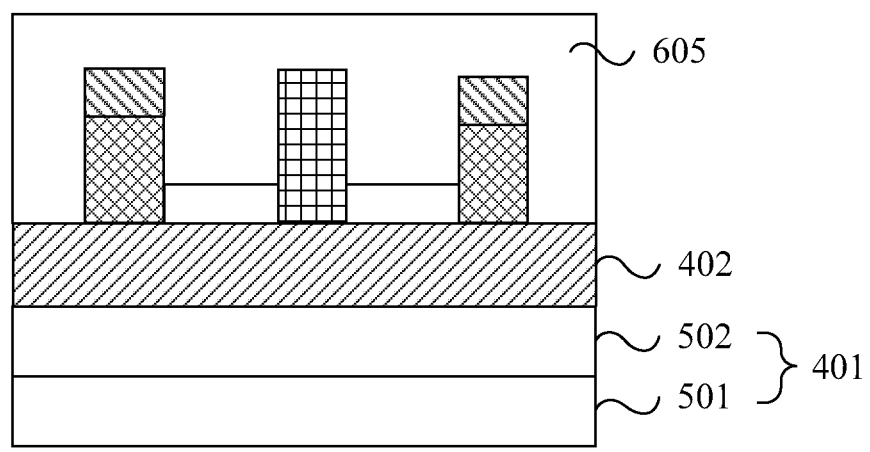

Optionally, as shown in FIG. 5E, based on FIG. 5D, a PECVD method may be further used to deposit the SiN passivation layer 605. The SiN passivation layer 605 can be used for protection, for example, absorbing moisture in the air that enters the semiconductor device, so as to avoid affecting conductivity of the source electrode 602 and the drain electrode 603, and improve reliability of the semiconductor device with a GaN substrate.

Optionally, the forming the semiconductor structure in this step may further include forming a metal interconnection layer (not shown) after the SiN passivation layer is formed. In the prior art, metal interconnection layers formed by various metal interconnection processes are already available, which will not be described herein again.

According to the semiconductor device formed in this embodiment, in a substrate used by the semiconductor device, the p-type GaN layer 403 is formed on the AlGaN layer 402, and a hole charge carrier in the p-type GaN layer 403 can be used to exhaust surface state negative electrons on the n-type AlGaN layer 402, neutralize a dangling bond on a section of the AlGaN layer 402, and prevent the forming of a virtual gate, so as to suppress a current collapse effect of the semiconductor device according to this embodiment, thereby improving performance of the semiconductor device, and enhancing reliability of the semiconductor device.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A gallium nitride (GaN) substrate, comprising:
   a GaN base;
   an aluminum gallium nitride (AlGaN) layer disposed on the GaN base;
   a p-type conducting layer disposed on an active area of the AlGaN layer; and
   a gate electrode, a source, and a drain disposed on the active area of the AlGaN layer,
   wherein the p-type conducting layer contacts a sidewall of the gate electrode,
   wherein the p-type conducting layer is laterally spaced between the gate electrode and at least one of the source and the drain, and
   wherein the p-type conducting layer is configured to exhaust surface state negative electrons on the AlGaN layer and neutralize a dangling bond on the AlGaN layer.

2. The GaN substrate according to claim 1, wherein the GaN base comprises:
   a base layer made of silicon carbide (SiC), sapphire, or silicon (Si); and
   a GaN layer disposed on the base layer.

3. The GaN substrate according to claim 2, wherein the p-type conducting layer is a p-type GaN layer.

4. The GaN substrate according to claim 3, wherein the p-type GaN layer is a GaN layer doped with beryllium (Be), a GaN layer doped with zinc (Zn), or a GaN layer doped with magnesium (Mg).

5. A semiconductor device, comprising:
a gallium nitride (GaN) substrate; and
a semiconductor structure formed on the GaN substrate,
wherein the GaN substrate comprises:
  a GaN base;
  an aluminum gallium nitride (AlGaN) layer disposed on the GaN base;
  a p-type conducting layer disposed on an active area of the AlGaN layer; and
  a gate electrode, a source, and a drain disposed on the active area of the AlGaN layer,
  wherein the p-type conducting layer contacts a sidewall of the gate electrode,
  wherein the p-type conducting layer is laterally spaced between a gate electrode and at least one of a source and a drain, and
  wherein the p-type conducting layer is configured to exhaust surface state negative electrons on the AlGaN layer and neutralize a dangling bond on the AlGaN layer.

6. The semiconductor device of claim 5, wherein the p-type conducting layer has a hole density in a range of $10^{17}$ to $10^{18}$ cm$^{-3}$.

7. A method for fabricating a gallium nitride (GaN) substrate, comprising:
forming an aluminum gallium nitride (AlGaN) layer on a GaN base;
forming a gate electrode, a source, and a drain on an active area of the AlGaN layer; and
  forming a p-type conducting layer on the active area of the AlGaN layer, wherein the p-type conducting layer contacts a sidewall of the gate electrode, wherein the p-type conducting layer is laterally spaced between the gate electrode and at least one of the source and the drain, and wherein the p-type conducting layer is configured to exhaust surface state negative electrons on the AlGaN layer and neutralize a dangling bond on the AlGaN layer.

8. The method for fabricating the GaN substrate according to claim 7, wherein before forming the AlGaN layer on the GaN base, the method further comprises forming the GaN base, wherein forming the GaN base comprises:
providing a base layer, wherein the base layer is made of silicon carbide (SiC), sapphire, or silicon (Si); and
forming a GaN layer on the base layer.

9. The method for fabricating the GaN substrate according to claim 7, wherein forming the p-type conducting layer on the active area of the AlGaN layer comprises forming a p-type GaN layer on the active area of the AlGaN layer.

10. The method for fabricating the GaN substrate according to claim 9, wherein the p-type GaN layer is a GaN layer doped with beryllium (Be), a GaN layer doped with zinc (Zn), or a GaN layer doped with magnesium (Mg).

11. The method for fabricating the GaN substrate according to claim 10, wherein forming the GaN layer doped with Mg on the active area of the AlGaN layer comprises:
growing the GaN layer doped with Mg on the AlGaN layer with a gas mixture of ammonia gas (NH3), trimethyl gallium (TMGa), and bis-cyclopentadienyl magnesium (Cp$_2$Mg) as a source gas, hydrogen (H$_2$) as a carrier gas, a reaction pressure of 2 to 3 Pascal (Pa), and a growth temperature of 900 to 1100 degrees Celsius (° C.); and
performing annealing treatment on the GaN layer doped with Mg in a nitrogen (N$_2$) atmosphere of 700 to 800° C., wherein an annealing duration is 20 to 30 minutes to form a final GaN layer doped with Mg.

12. A method for fabricating a semiconductor device, comprising:
forming a gallium nitride (GaN) substrate by using a method for fabricating a GaN substrate; and
forming a semiconductor structure on the GaN substrate, wherein the method for fabricating the GaN substrate comprises:
  forming an aluminum gallium nitride (AlGaN) layer on a GaN base;
  forming a gate electrode, a source, and a drain on an active area of the AlGaN layer; and
forming a p-type conducting layer on the active area of the AlGaN layer, wherein the p-type conducting layer contacts a sidewall of the gate electrode, wherein the p-type conducting layer is laterally spaced between the gate electrode and at least one of the source and the drain, and wherein the p-type conducting layer is configured to exhaust surface state negative electrons on the AlGaN layer and neutralize a dangling bond on the AlGaN layer.

13. The method for fabricating the semiconductor device according to claim 12, wherein before forming the AlGaN layer on the GaN base, the method for fabricating the GaN substrate further comprises forming the GaN base, wherein forming the GaN base comprises:
providing a base layer, wherein the base layer is made of silicon carbide (SiC), sapphire, or silicon (Si); and
forming a GaN layer on the base layer.

14. The method for fabricating the semiconductor device according to claim 12, wherein forming the p-type conducting layer on the active area of the AlGaN layer comprises forming a p-type GaN layer on the active area of the AlGaN layer.

15. The method for fabricating the semiconductor device according to claim 14, wherein the p-type GaN layer is a GaN layer doped with beryllium (Be), a GaN layer doped with zinc (Zn), or a GaN layer doped with magnesium (Mg).

16. The method for fabricating the semiconductor device according to claim 15, wherein forming the GaN layer doped with Mg on the active area of the AlGaN layer comprises:
growing the GaN layer doped with Mg on the AlGaN layer with a gas mixture of ammonia gas (NH$_3$), trimethyl gallium (TMGa), and bis-cyclopentadienyl magnesium (Cp$_2$Mg) as a source gas, hydrogen (H$_2$) as a carrier gas, a reaction pressure of 2 to 3 Pascal (Pa), and a growth temperature of 900 to 1100 degrees Celsius (° C.); and
performing annealing treatment on the GaN layer doped with Mg in a nitrogen (N$_2$) atmosphere of 700 to 800° C., wherein an annealing duration is 20 to 30 minutes to form a final GaN layer doped with Mg.

17. The method for fabricating the semiconductor device according to claim 16, wherein the p-type conducting layer has a hole density in a range of $10^{17}$ to $10^{18}$ cm$^{-3}$.

\* \* \* \* \*